United States Patent
Tsay et al.

(10) Patent No.: US 7,476,555 B2
(45) Date of Patent: Jan. 13, 2009

(54) METHOD OF CHIP MANUFACTURING

(75) Inventors: Wen Tsay, Taipei Hsien (TW); Bao-Iai Hwang, Taipei Hsien (TW); David Y Chang, Taipei Hsien (TW); Ling Huang, Taipei Hsien (TW)

(73) Assignee: AirDio Wireless Inc., Taipei Hsien (TW)

( * ) Notice: Subject to any disclaimer, the term of this patent is extended or adjusted under 35 U.S.C. 154(b) by 86 days.

(21) Appl. No.: 11/599,473

(22) Filed: Nov. 15, 2006

(65) Prior Publication Data

US 2008/0113457 A1 May 15, 2008

(51) Int. Cl.
G01R 31/26 (2006.01)
H01L 21/66 (2006.01)
(52) U.S. Cl. .............................. 438/15; 438/18; 438/113
(58) Field of Classification Search ................... 438/15, 438/17, 18, 113
See application file for complete search history.

(56) References Cited

U.S. PATENT DOCUMENTS

| 6,927,593 | B2 * | 8/2005 | Kline | 324/765 |
|---|---|---|---|---|
| 6,967,494 | B2 * | 11/2005 | Kline | 324/760 |
| 2004/0113283 | A1 * | 6/2004 | Farnworth et al. | 257/782 |
| 2005/0181540 | A1 * | 8/2005 | Farnworth | 438/113 |
| 2005/0253140 | A1 * | 11/2005 | Beatson | 257/48 |
| 2006/0019468 | A1 * | 1/2006 | Beatty et al. | 438/464 |
| 2006/0038172 | A1 * | 2/2006 | Akram | 257/48 |
| 2006/0043364 | A1 * | 3/2006 | Jiang et al. | 257/48 |
| 2007/0080448 | A1 * | 4/2007 | DeMulder et al. | 257/723 |
| 2007/0145564 | A1 * | 6/2007 | Honer | 257/690 |
| 2007/0148824 | A1 * | 6/2007 | Nystrom et al. | 438/113 |
| 2008/0003720 | A1 * | 1/2008 | Lu et al. | 438/113 |
| 2008/0032452 | A1 * | 2/2008 | Yang et al. | 438/113 |

* cited by examiner

*Primary Examiner*—Fernando L Toledo
(74) *Attorney, Agent, or Firm*—Muncy, Geissler, Olds & Lowe, PLLC

(57) ABSTRACT

A method of chip manufacturing, comprises of a design stage; a simulation stage; a foundry stage; a testing/packaging stage; a cutting stage; and a final coating stage. The present invention provides a method of chip testing comprises of disposing a substrate layer on a wafer having a plurality of chips; exposing a plurality of pads on the chips of the wafer; forming bumps on the pads of the chips of the wafer; performing tests from the bumps on the chips of the wafer. Alternatively, the present invention provides a method of chip testing comprises of disposing a substrate layer on a wafer having a plurality of chips; connecting a plurality of pads on the chips of the wafer to a plurality of corresponding pads on the substrate layer; planting bumps on the pads on the opposite side of the substrate layer; performing tests from the bumps on the substrate layer.

24 Claims, 7 Drawing Sheets

METHOD OF CHIP MANUFACTURING

BACKGROUND

1. Field of Invention

The present invention relates to a method of chip manufacturing. More particularly, the present invention relates to a method chip testing and packaging during the process of chip manufacturing.

2. Description of Related Art

As electronic devices are becoming smaller and slimmer, IC chip manufacturing process is becoming more complex. FIG. 1 shows a flow chart of the conventional manufacturing process essentially consists of a design stage 101, a simulation stage 102, a foundry stage 103, a DC/RF probing stage 104, a cutting stage 105, a packaging/coating stage 106 and a final testing stage 107. Difficulties arise when the DC/RF probing stage 104 is not carried out in an easy, accurate and cost efficient manner. The current DC/RF probing stage 104 is done before cutting to ensure only the good dies are packaged. The primary purpose of such probing is to save packaging costs. Probes move to designated pads by an X-Y coordinate controlling scheme and probes each pad on the chip individually. The DC/RF probing stage 104, especially RF probing, lacks accuracy, as the result curves will shift over time creating high error rates in measurements. Even if accurate measurements can be obtained, the results may not be a good representation of the chip performance since packaging will introduce additional parasitics degrading the performance in the RF domain. This creates many problems in the design cycle since the designer will not discover many design flaws until after packaging. Re-designing the IC after packaging is a time consuming and painful process. The re-design cycle may take months and with the current DC/RF probing stage 104, it is hard for the simulation results to be a close estimation of the actual performance before packaging. Furthermore, the cost of DC/RF probing is very high. It may take thousands of probes to perform the DC probing test and the cost of RF probe is in the range of hundreds of dollars each. RF probes are also very fragile and wear off relatively fast. They also may damage the pads. Since a typical RF wafer yield is in between 50% and 70%, we cannot simply drop the wafer probing test to save the manufacturing cost.

As the trend also demands faster processing speed and ubiquitous communication, thus the IC design will require higher frequency and integrated multiple standards in a single chip, and inevitably becomes more difficult to verify due to increasing complexity and interferences. As a result, it will have a longer IC design cycle and lower yield rate.

For the forgoing reasons, there is a need for a new method of chip manufacturing. More particularly, a new method of testing and packaging to simplify and cost down the design cycle, especially at the DC/RF probing stage 104.

SUMMARY

It is therefore an objective of the present invention to provide a method of chip manufacturing process. The method comprises of a design stage, a simulation stage, a foundry stage, a testing/packaging stage, a cutting stage, and a final coating stage. When compared with the conventional manufacturing process, the testing/packaging stage combines the DC/RF probing stage, the packaging/coating stage and the final testing stage into a single post-foundry stage. In the testing/packaging stage, the chips on the wafer are protected by disposing a substrate layer on the wafer. The substrate layer may be a borophosphosilicate glass layer, a borosilicate glass layer, a phosphosilicate glass layer, a silicon oxide layer, a silicon oxynitride layer or a silicon nitride layer. For the purpose of I/O access, the pads of the chips need to be exposed and bumps are formed onto the pads, the forming of the bumps are referred to as bumping. The substrate layer may also be a ceramic layer having electrical routings and corresponding pads to the pads on the wafer. The wafer may be attached to the ceramic layer by a flip chip attachment and bumps are formed on the pads on the opposite side of the ceramic layer. The bumps protrude out of the surface of the substrate layer to provide I/O access to the chip. The two purposes (protection and I/O access) complete the purpose of packaging. The package is near the size of the chip itself comparable to the advanced packages such as chip scale packages (CSP).

Therefore, after the wafer is packaged, it is ready for testing at the wafer level. Testing at the wafer level is referred to as strip testing. All tests may be done at this stage including DC/RF tests, final tests, and also subsystem level and main system level tests. Instead of using individual probes to probe each pad of a chip, a socket made with corresponding pins to the pads of a particular chip is used to access all the bumps on the chip. The DC/RF tests conducted directly from the bumps are more accurate because it is now a post-package test providing near actual performance test results and enhancing the reliability of the simulation. The parasitic effects on the test results will be kept at a minimum because bumping provides the shortest path from the IC circuit pads to the outside circuitry and does not have the large parasitic effects of other packaging methods such as wire bonding. By conducting the DC/RF tests directly on the bumps, the risk of damaging the pads are substantially reduced. DC/RF tests performed using sockets on bumps save time because chip pads are not probed individually but at the same time with a socket. The tests not only performed with one socket at a time, multiple sockets may be used to test multiple chips. The replacement of probes with sockets also eliminates the cost of the probing equipment. Other tests such as functional tests and final tests may be done at this stage. The design cycle will be significantly shortened due to more reliable simulation results and due to combining all testing and packaging into a single stage to provide lesser manufacturing stages.

The tests conducted directly through the bumping process may further include subsystem level tests and main system level tests. The subsystem level tests are performed by connecting a socket to a subsystem, such as a system on a printed circuit board (PCB). The subsystem level tests allow the compatibility of the chip with the system to be known and also the subsystem performance may be specified along with the individual chip specifications. The testing may be extended further to the main system level. All functions of a complete main system such as a mobile phone or a laptop computer may be tested.

When the testing and packaging are finished, the wafer is cut into individual units. A final coating such as epoxy encapsulates the units to complete the manufacturing cycle.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
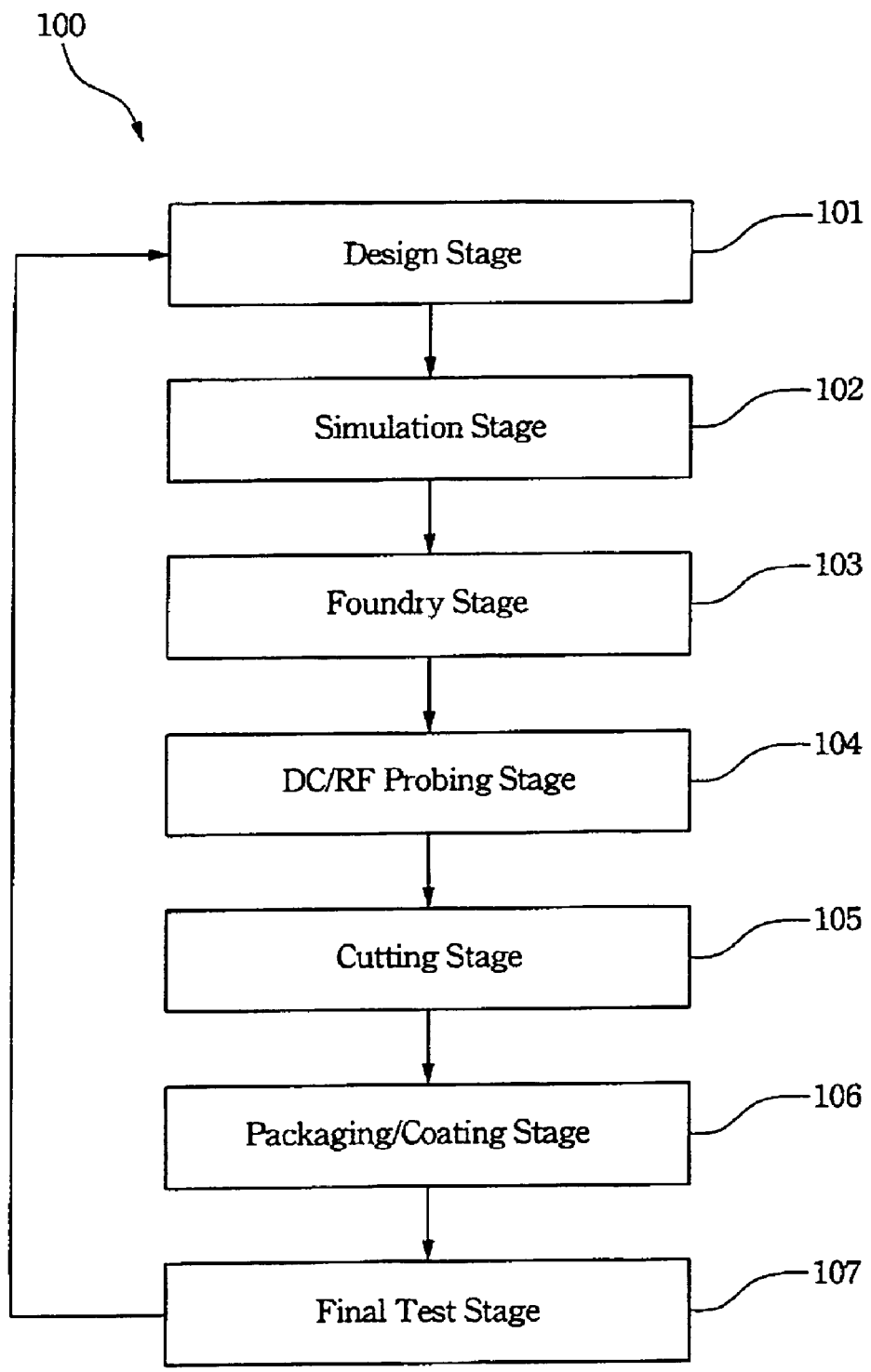
FIG. 1 is a flow chart of the conventional manufacturing process.

Reference will now be made in detail to the present preferred embodiments of the invention, examples of which are illustrated in the accompanying drawings. Wherever possible, the same reference numbers are used in the drawings and the description to refer to the same or like parts.

Figure 2:
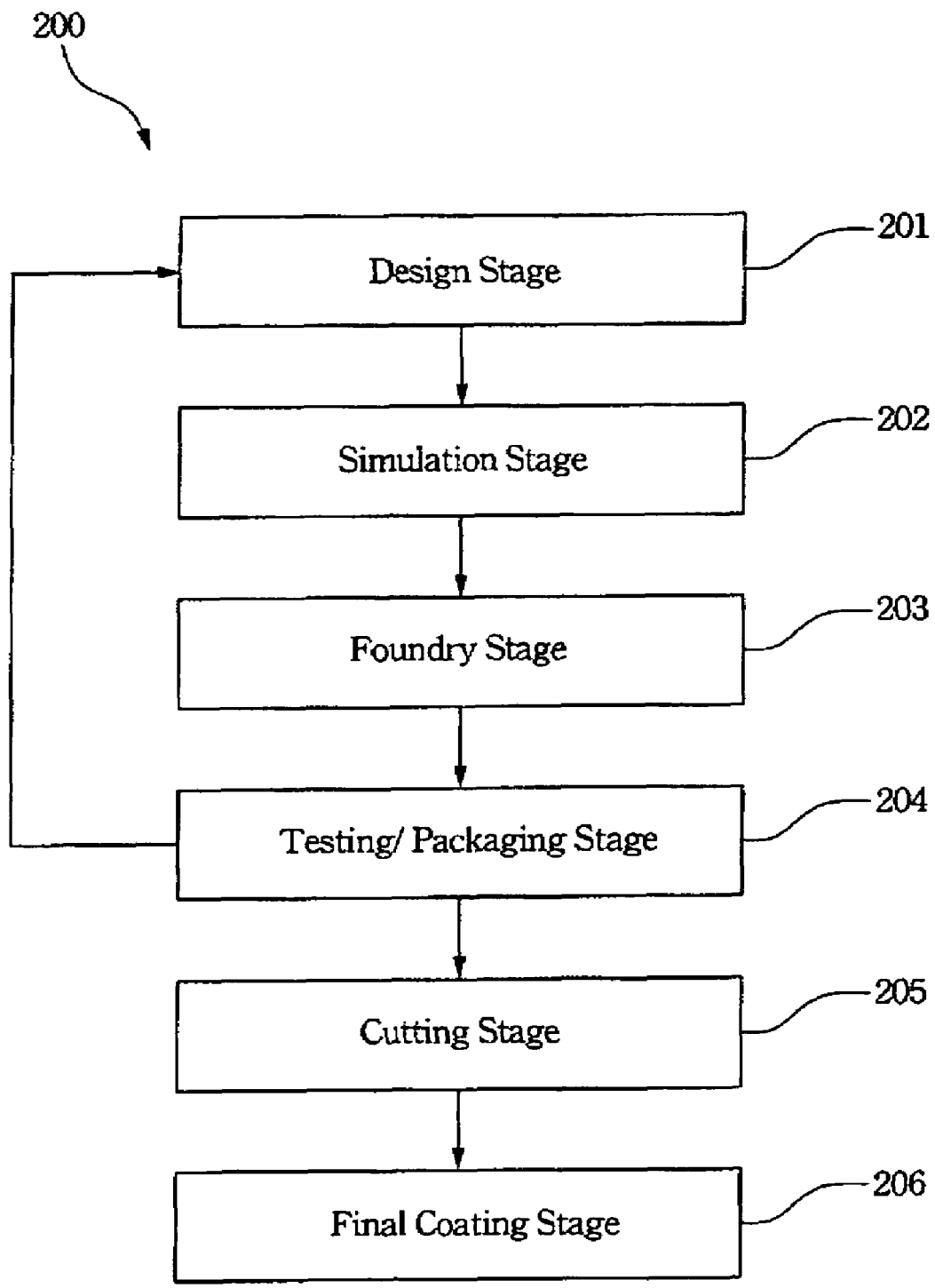
FIG. 2 is a flow chart of the chip manufacturing process according to the present invention.

FIG. 2 is a flow chart of the chip manufacturing process according to the present invention. The chip manufacturing process 200 includes a design stage 201, a simulation stage 202, a foundry stage 203, a testing/packaging stage 204, a cutting stage 205, and a final coating stage 206. At the design stage 201, the IC chip is designed at the theoretical level. At the simulation stage 202, the design is simulated to model the circuit performance. Once simulation is finished, the design is taped out to the foundry to be fabricated onto a wafer at the foundry stage 203. After the chips are fabricated onto a wafer, the wafer is sent for testing and packaging at the testing/packaging stage 204 where all necessary tests are performed at the wafer level with sockets and the chips are packaged prior to testing. If the chips fail to meet the required specifications, the process then returns to the design stage 201 for re-design. After the chips comply with the requirements, the tested and packaged wafer is cut into individual units at the cutting stage 205. A final coating, such as epoxy, is then applied at the final coating stage 206.

Figure 3:
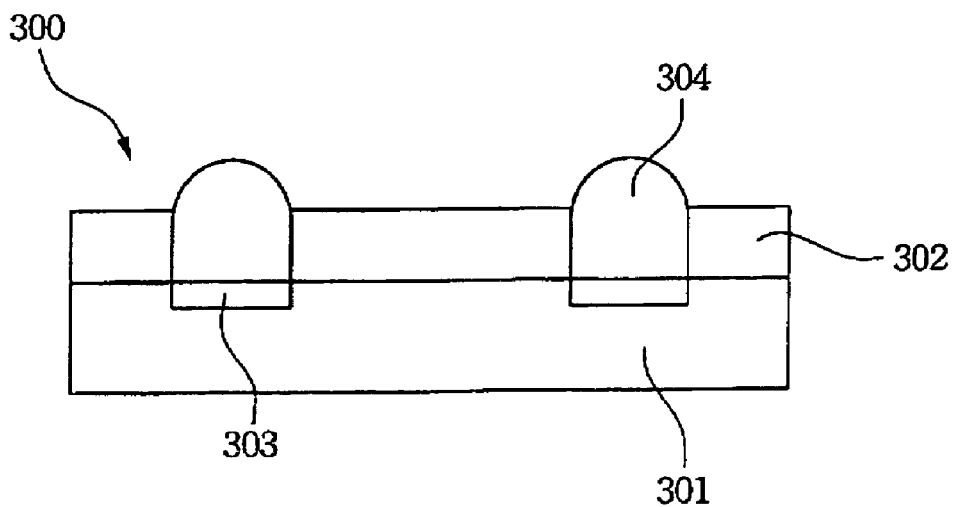
FIG. 3 is a cross-section view of a chip on the wafer at the testing/packaging stage according to one embodiment of the present invention.

As shown in FIG. 3, a cross-section view of a chip on the wafer at the testing/packaging stage according to one embodiment of the present invention, a substrate layer 302 is disposed on top of the wafer surface 301. The substrate layer 302 is an insulation layer, such as a borophosphosilicate glass layer, a borosilicate glass layer, a phosphosilicate layer, a silicon oxide layer, a silicon oxynitride layer or a silicon nitride layer. In this embodiment, the substrate layer 302 is spun onto the wafer surface 301 for protection. In order to provide I/O access for the chip 300 on the wafer, pads 303 on the chip 300 need to be exposed. A lithography process may provide openings on top of the pads 303 to expose pads 303 for I/O access. After the pads 303 are exposed, bumps 304 such as solder bumps, are planted into the openings making connections with the pads 303; such process is referred to as bumping. The bumps 304 also can be formed by a metal plating process. The bumps 304 protrude out of the surface of the substrate layer 302. The bumping process allows I/O access for the chip 300 on the wafer. Once the protection and I/O access steps are applied to chips 300 on the wafer, the chip are considered "packaged". This package may be as small as the chip size, which is comparable to the near chip-size packages such as CSP. The packaged chip 300 is also ready for testing.

Figure 4:
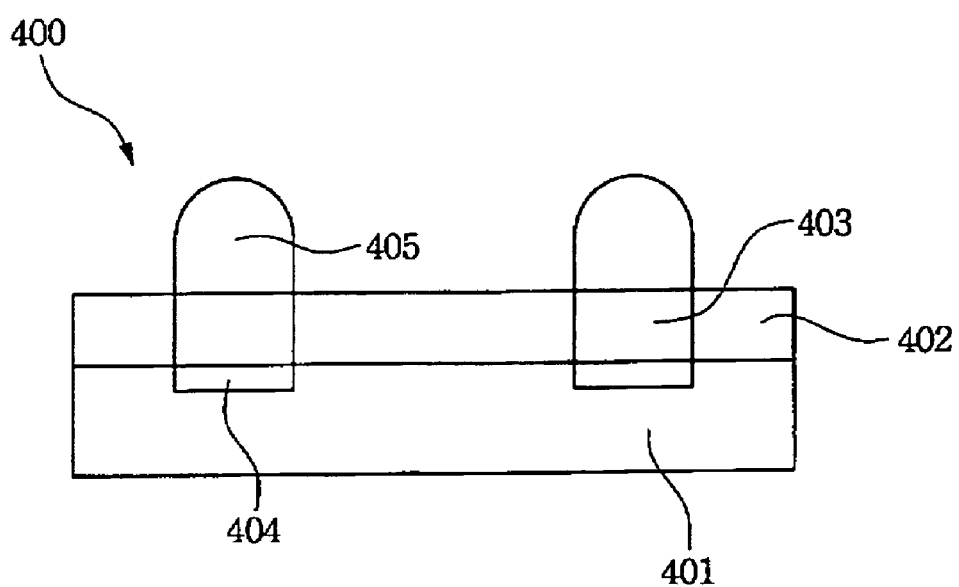
FIG. 4 is a cross-section view of a chip on the wafer at the testing/packaging stage according to another embodiment of the present invention.

As shown in FIG. 4, a cross-section view of a chip on the wafer at the testing/packaging stage according to another embodiment of the present invention, a substrate layer 402 is disposed on top of the wafer surface 401. The substrate layer 402 may be a ceramic layer. In this embodiment, the substrate layer 402 allows for metal routing (not shown) within the layer. The substrate layer 402 has pads 403 with corresponding placement to the placement of the chip pads 404. The substrate layer pads 403 couple with the chip pads 404 and bumps 405 are planted on top of the substrate layer pads 403 on the opposite side.

Figure 5:
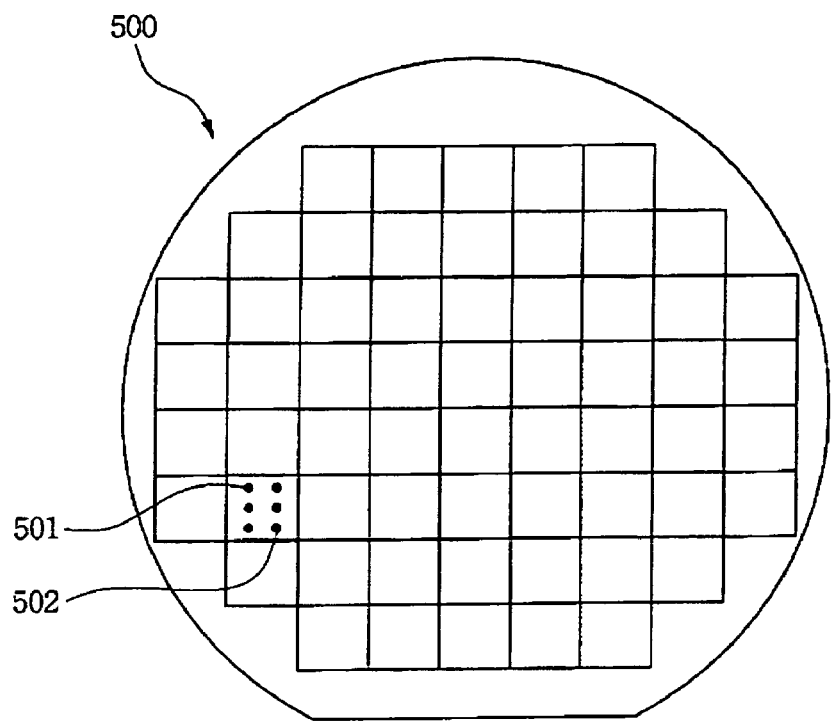
FIG. 5 is a top view of the wafer.
Figure 6:
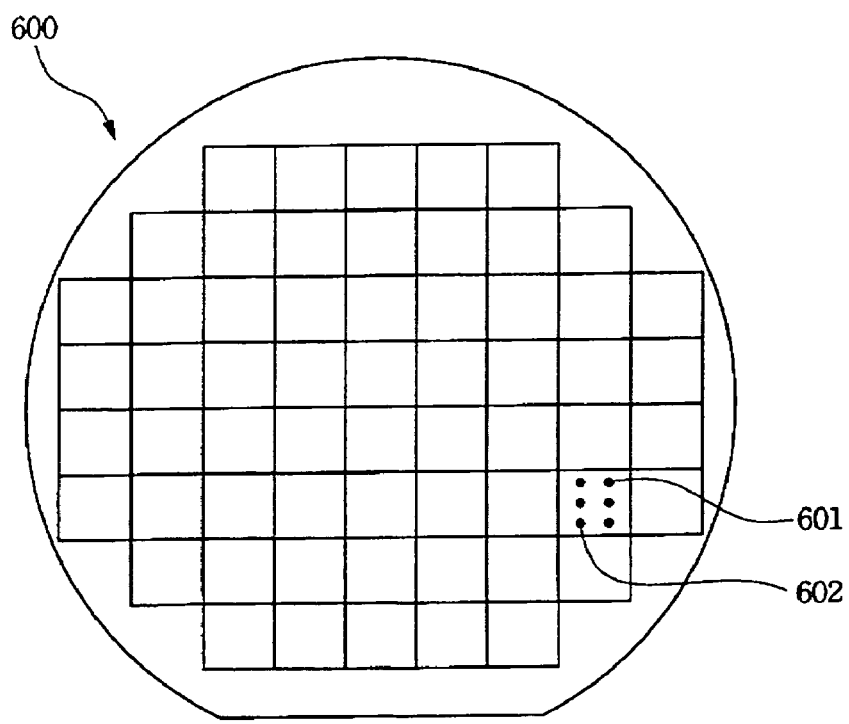
FIG. 6 is a top view of the ceramics layer.

The ceramic layer cannot be spun onto the wafer. Thus, the ceramic layer is disposed on the wafer by a flip chip method. Refer to FIG. 5 and FIG. 6 simultaneously; FIG. 5 is the top view of the wafer and FIG. 6 is the top view of the ceramics layer. The wafer 500 will be flipped onto the ceramic layer 600 via the flip chip method with the ceramic layer pads in alignment with the corresponding chip pads. For example, pad 501 on the wafer 500 will be aligned with pad 601 on the ceramic layer 600, and pad 502 on the wafer 500 will be aligned with pad 602 on the ceramic layer 600. Thereafter, the bumps forming method disclosed in FIG. 4 is also performed to form bumps (not shown) on the opposite side of the pads on the ceramic layer 600. This embodiment of the present invention provides additional metal routing while packaging the chips on the wafer.

After the insulation layer and bumping are applied to the wafer by the methods mentioned above, testing on the wafer level follows. The tests are conducted on the packaged chips directly on the wafer. This wafer level testing is referred to as strip testing. They may include DC/RF tests, functional tests, final tests, subsystem level tests and main system level tests. Instead of using single contact point probes to conduct probing tests, all tests use a socket with matching pins to the bumping on the chip to access the bumps on the wafer all at once.

Figure 7:
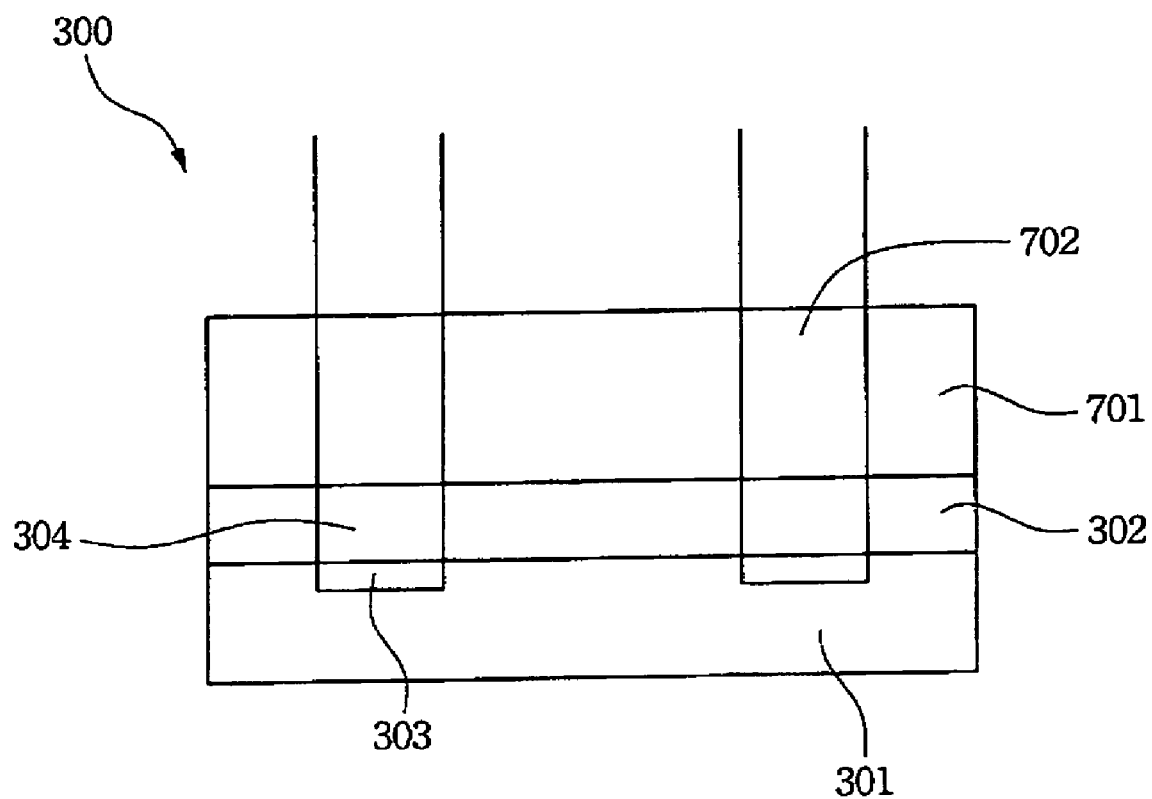
FIG. 7 is a cross-section view of a chip on the wafer under strip tests.

As shown in FIG. 7, a cross-section view of a chip on the wafer under strip tests, using a socket 701, the socket 701 acts as a large probe probing the chip 300 on the wafer. Take the chip in the embodiment from FIG. 3 as an example, the bumps 304 are connected to corresponding socket pins 702. Once the chip 300 is inserted into the socket 701, the socket pins 702 are the I/O access point of the chip where they are connected directly to the testing equipment. The strip tests may include testing a single chip with a single socket or the strip tests may be conducted where multiple sockets may be used to test multiple chips on the wafer simultaneously. Different chips with different pin configurations require different custom made sockets to match the configuration.

The bumps also provide a short conduction path from the chip pads to the outside circuitry. The path is substantially shorter than wire bonding where a bond wire is much longer in length than a solder bump. The short conduction path reduces packaging parasitic effects on the chip performance significantly, which provides more accurate simulation results as compared with actual chip performance. Also, the DC/RF test is now a post-packaging test where the results represent the performance of the chip after the chip is packaged. Accurate and reliable simulations lead to less number of design cycles, saving time and lowering the cost.

Figure 8:
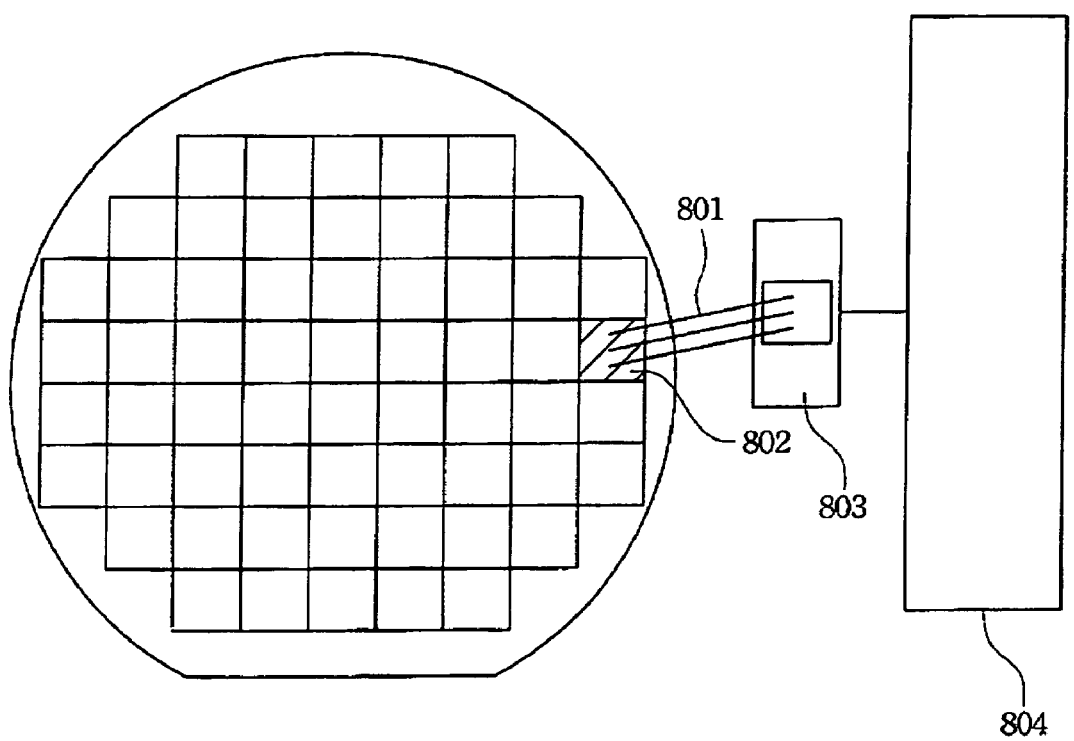
FIG. 8 is an exemplary connection setup from a socket to an external subsystem.

FIG. 8 illustrates an exemplary connection setup from a socket to an external subsystem such as a system on a PCB. The socket lines 801 connect the socket 802 to the subsystem 803 connected to the testing equipment 804. The socket 802 provides the interface for the chip to be tested on the subsystem 803. One can now test the subsystem performance and examine the performance of the chip and its effect on the overall subsystem. The subsystem tests provide subsystem level test data to be available for design purposes. The subsystem tests also may determine the compatibility of the chip with various subsystems.

Figure 9:
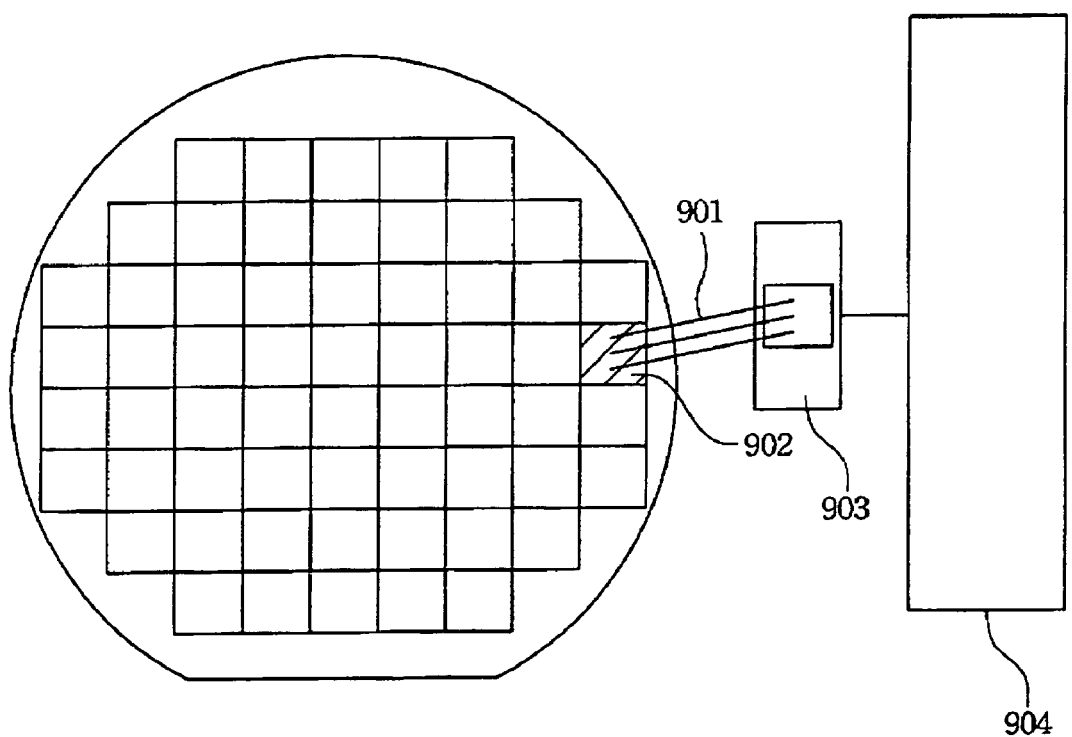
FIG. 9 is an exemplary connection setup from a socket to an external subsystem and from the system to an external main system.

FIG. 9 illustrates an exemplary connection setup from a socket to an external subsystem and from the subsystem to a main system such as a mobile phone or a laptop computer. The socket lines 901 connect the sockets 902 to the subsystem 903. The socket 902 provides the interface for the chip to be tested on the subsystem 903. A main system 904 is then connected to the subsystem 903. One can now test the main system performance and examine the performance of the chip and its effect of the overall main system. The main system tests provide main system level test data to be available for design purposes. The main system tests also may determine the compatibility of the chip with various main systems. The compatibility of the subsystem with other subsystems in the main system may also be determined.

Figure 10:
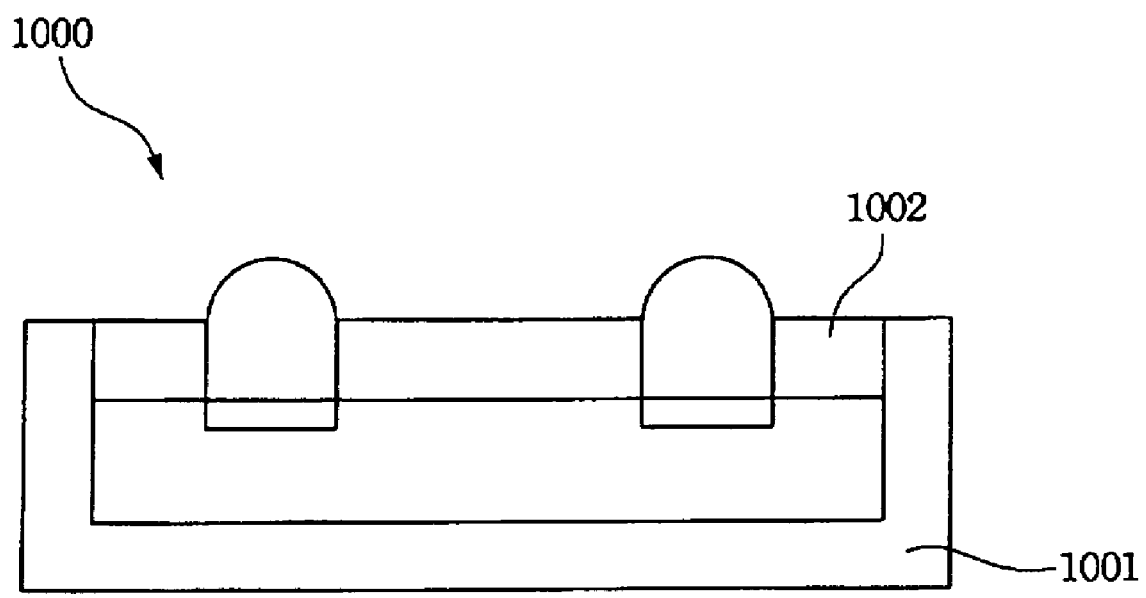
FIG. 10 shows a cross-section view of an individual unit with a final coating for isolation and protection.

After all tests are completed, the packaged chips are sawed into individual semiconductor package units at the cutting stage. The sides of the individual units are exposed to the ambient environment and therefore a final coating is needed to encapsulate each chip for the purpose of isolation and protection. FIG. 10 shows a cross-section view of an individual unit with a final coating for isolation and protection. The final coating 1001 may be an epoxy coating. The individual unit 1000 is encapsulated on all sides except for the side already protected by the substrate layer 1002.

As apparent from the above descriptions, the present invention provides a method of chip manufacturing. More particularly, the present invention relates to a method chip testing and packaging during the process of chip manufacturing. The present invention combines the DC/RF probing stage 104, the packaging/coating stage 106 and the final testing stage 107 of the conventional chip manufacturing process 100 into a single testing/packaging stage 204. The new approach simplified the testing and packaging steps necessary in the chip manufacturing process. The design cycle is shortened, cost is lowered due to the elimination of more complex testing and packaging steps. The simplified process will likely encourage more design attempts on complex semiconductor chips such as system on chip (SoC) architectures.

The testing/packaging stage 204 provides direct testing from the bumps on chip pads, thus leads to better accuracy and cost saving. The subsystem level and main system level tests provide the chip to be fully integrated onto a subsystem and onto a main system to be tested at the subsystem level and main system level before the chip is cut into individual units.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of chip testing and packaging, comprising:
providing a wafer having a plurality of chips with pads exposed on the wafer's surface;
disposing an insulation layer over the wafer's surface;
forming a plurality of bumps on the insulation layer to connect with the pads of the chips through the insulation layer,
wherein the bumps provide I/O access for the chips on the wafer; and
testing at least one chip on the wafer by placing at least one socket to contact the bumps on the chip;
dividing the wafer into separate individual chips; and
applying a final coating to encapsulate remaining surfaces of each of the separate individual chips, which are not encapsulated by the insulation layer.

2. The method of chip testing and packaging of claim 1, wherein the insulation layer is a borophosphosilicate glass layer, a borosilicate glass layer, a phosphosilicate layer, a silicon oxide layer, a silicon oxynitride layer or a silicon nitride layer.

3. The method of chip testing and packaging of claim 1, wherein the bumps are solder bumps.

4. The method of chip testing and packaging of claim 1, wherein the bumps are formed by a metal plating method.

5. The method of chip testing and packaging of claim 1, wherein the tests are DC/RF tests.

6. The method of chip testing and packaging of claim 1, wherein the tests are functional tests.

7. The method of chip testing and packaging of claim 1, wherein the tests are final tests.

8. The method of chip testing and packaging of claim 1, wherein the tests are subsystem level tests verifying the chip performance along with the subsystem performance when the chips under test are connected to an external subsystem.

9. The method of chip testing and packaging of claim 1, wherein the tests are main system level tests verifying the subsystem performance along with the main system performance when the external subsystem is connected to an external main system.

10. The method of chip testing and packaging of claim 1, wherein the final coating is epoxy.

11. A method of chip testing and packaging, comprising:
disposing a substrate layer on a wafer having a plurality of chips, wherein the substrate layer protects the wafer;
connecting a plurality of pads on the chips of the wafer to a plurality of corresponding pads on the substrate layer;
forming a plurality of bumps on the pads on the opposite side of the substrate layer;
testing at least one chip on the wafer by placing at least one socket to contact the bumps on the opposite side of the substrate layer;
dividing the wafer into separate individual chips; and
applying a final coating to encapsulate remaining surfaces of each of the separate individual chips, which are not encapsulated by the substrate layer.

12. The method of chip testing and packaging of claim 11, wherein the substrate layer is a ceramic layer, and the final coating is epoxy.

13. The method of chip testing and packaging of claim 12, wherein the ceramic layer provides additional electrical routing to the circuitry on the chips of the wafer.

14. The method of chip testing and packaging of claim 11, wherein the bumps are solder bumps.

15. The method of chip testing and packaging of claim 11, wherein the bumps are formed by a metal plating method.

16. The method of chip testing and packaging of claim 11, wherein the tests are DC/RF tests.

17. The method of chip testing and packaging of claim 11, wherein the tests are functional tests.

18. The method of chip testing and packaging of claim 11, wherein the tests are final tests.

19. The method of chip testing and packaging of claim 11, wherein the tests are subsystem level tests verifying the chip performance along with the subsystem performance when the chips under test are connected to an external subsystem.

20. The method of chip testing and packaging of claim 11, wherein the tests are main system level tests verifying the subsystem performance along with the main system performance when the external subsystem is connected to an external main system.

21. The method of chip testing and packaging of claim 11, wherein the final coating is epoxy.

22. A method of chip manufacturing, comprising:
designing a chip;
simulating the chip with a simulator;
taping out chip design onto a processed wafer;
packaging a surface of the chip, on which pads are formed, at wafer level by using a first package material;
forming bumps connect the pads of the chip and testing the chip by placing at least one socket to contact the bumps;
cutting the tested packaged wafer into separate individual chips; and
applying a final coating to encapsulate remaining surfaces of each of the separate individual chips, which is not packaged at wafer level, by using a second package material.

23. The method of chip manufacturing of claim 22, wherein the first package material is different from the second package material.

24. The method of chip manufacturing of claim 23, wherein the second package material is epoxy.

* * * * *